United States Patent
He et al.

(10) Patent No.: US 8,178,779 B2
(45) Date of Patent: May 15, 2012

(54) ORGANIC PHOTOVOLTAIC CELLS

(75) Inventors: Jin-An He, Parsippany, NJ (US); Russell Gaudiana, Merrimack, NH (US); David Waller, Lexington, MA (US); Lian Wang, Lowell, MA (US); Srini Balasubramanian, Westford, MA (US); Jeremiah Mwaura, Lowell, MA (US); Christoph Brabec, Linz (AT)

(73) Assignee: Konarka Technologies, Inc., Lowell, MA (US)

( * ) Notice: Subject to any disclaimer, the term of this patent is extended or adjusted under 35 U.S.C. 154(b) by 824 days.

(21) Appl. No.: 12/260,416

(22) Filed: Oct. 29, 2008

(65) Prior Publication Data

US 2010/0024860 A1    Feb. 4, 2010

Related U.S. Application Data

(60) Provisional application No. 60/985,006, filed on Nov. 2, 2007.

(51) Int. Cl.
*H01L 31/00* (2006.01)

(52) U.S. Cl. ........................................ 136/263

(58) Field of Classification Search .................. 136/263
See application file for complete search history.

(56) References Cited

U.S. PATENT DOCUMENTS

| | | | |
|---|---|---|---|
| 2003/0140959 A1* | 7/2003 | Gaudiana et al. | 136/244 |
| 2006/0076557 A1 | 4/2006 | Waller et al. | |
| 2007/0131914 A1 | 6/2007 | Elschner et al. | |
| 2008/0142079 A1* | 6/2008 | Ting et al. | 136/263 |
| 2008/0163927 A1* | 7/2008 | Sohn et al. | 136/263 |

FOREIGN PATENT DOCUMENTS

GB    2 424 121    9/2006

OTHER PUBLICATIONS

Nguyen et al., "Effects of Annealing on the Nanomorphology and Performance of Poly(alkylthiophene):Fullerene Bulk-Heterojunction Solar Cells," Adv. Funct. Mater., 17(7):1071-1078, (2007).

\* cited by examiner

*Primary Examiner* — Jennifer Michener
*Assistant Examiner* — Miriam Berdichevsky
(74) *Attorney, Agent, or Firm* — Fish & Richardson P.C.

(57) ABSTRACT

This disclosure relates to a photovoltaic cell containing first and second electrodes, a photoactive layer between the first and second electrodes, and a hole transport layer between the first electrode and the photoactive layer. The hole transport layer consists of an ionic copolymer.

30 Claims, 3 Drawing Sheets

ORGANIC PHOTOVOLTAIC CELLS

CROSS REFERENCE TO RELATED APPLICATIONS

Pursuant to 35 U.S.C. §119(e), this application claims priority to U.S. Provisional Application Ser. No. 60/985,006, filed Nov. 2, 2007, the contents of which are hereby incorporated by reference.

TECHNICAL FIELD

This invention relates to organic photovoltaic cells, as well as related components, photovoltaic systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material can have a lower electrical conductivity than electrically conductive materials, the semiconductive material can transmit more light than many electrically conductive materials.

SUMMARY

This invention relates to organic photovoltaic cells, as well as related components, photovoltaic systems, and methods.

In one aspect, the disclosure features an article that includes first and second electrodes, a photoactive layer between the first and second electrodes, and a hole transport layer between the first electrode and the photoactive layer. The hole transport layer includes only one copolymer. The article is configured as a photovoltaic cell.

In another aspect, the disclosure features an article that includes a hole transport layer having first and second sides. The first side of the hole transport layer contacts an electrode, the second side of the hole transport layer contacts a photoactive layer, and the hole transport layer includes an ionic copolymer. The article is configured as a photovoltaic cell.

In a further aspect, the disclosure features an article that includes first and second electrodes, a photoactive layer between the first and second electrodes, and a hole transport layer between the first electrode and the photoactive layer. The hole transport layer is a single layer. The article is configured as a photovoltaic cell.

In an additional aspect, the disclosure features an article that includes first and second electrodes, a photoactive layer between the first and second electrodes, and a hole transport layer between the first electrode and the photoactive layer. The hole transport layer consists of one ionic copolymer. The article is configured as a photovoltaic cell.

In another aspect, the disclosure features a plurality of photovoltaic cells according to any of the preceding paragraphs, where the plurality of photovoltaic cells are configured as a photovoltaic system.

DESCRIPTION OF DRAWINGS

Like reference symbols in the various drawings indicate like elements.

DETAILED DESCRIPTION

Figure 1:
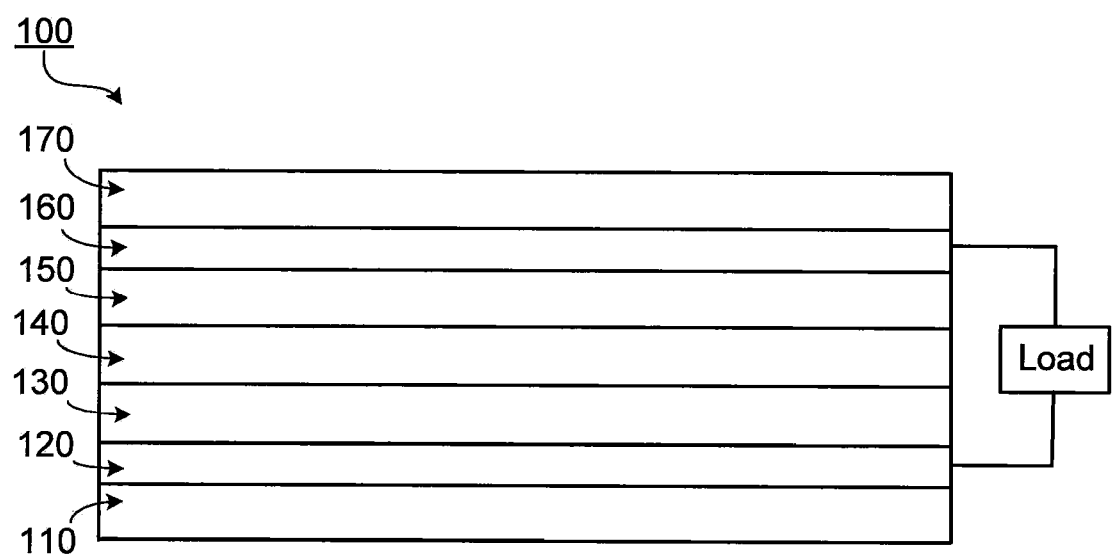
FIG. 1 is a cross-sectional view of an embodiment of a photovoltaic cell.

FIG. 1 shows a cross-sectional view of a photovoltaic cell 100 that includes a substrate 110, an electrode 120, a hole carrier layer 130, a photoactive layer 140 (e.g., containing an electron acceptor material and an electron donor material), an intermediate layer 150, an electrode 160, and a substrate 170.

In general, during use, light can impinge on the surface of substrate 110, and pass through substrate 110, electrode 120, and hole carrier layer 130. The light then interacts with photoactive layer 140, causing electrons to be transferred from the electron donor material (e.g., poly(3-hexylthiophene) (P3HT)) to the electron acceptor material (e.g., C61-phenyl-butyric acid methyl ester (PCBM)). The electron acceptor material then transmits the electrons through intermediate layer 150 to electrode 160, and the electron donor material transfers holes through hole carrier layer 130 to electrode 120. Electrodes 160 and 120 are in electrical connection via an external load so that electrons pass from electrode 160, through the load, and to electrode 120.

Hole carrier layer 130 (also known as hole transport layer) is generally formed of a material that, at the thickness used in photovoltaic cell 100, can facilitate the transport of holes to electrode 120 and substantially block the transport of electrons to electrode 120. Examples of materials from which layer 130 can be formed include various conducting/conjugate polymers, such as polythiophenes (e.g., poly(3,4-ethylene dioxythiophene) (PEDOT)), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, hole carrier layer 130 can include combinations of hole carrier materials.

Generally, the thickness of hole carrier layer 130 can vary as desired. In some embodiments, layer 130 is sufficiently thick to provide substantially complete coverage of the surface of photoactive layer 140 while filling any pores, valleys, or other roughness features that may exist. In some embodiments, excess hole carrier layer material can be applied beyond the minimum required to cover the roughness features, resulting in a thin layer of pure hole carrier material. In some embodiments, layer 130 is at least 10 nm (e.g., at least 12 nm, 14 nm, 16 nm, 18 nm, 20 nm) thick and/or at most 50 nm (e.g., at most 40 nm, 30 nm, 25 nm) thick.

Generally, the hole transport layer material in hole carrier layer 130 can include an ionomer. When applied as a layer (e.g., hole transport layer 130), the ionomer can dissociate into ions that aid or facilitate charge transport from photoactive layer 140 to electrode 120.

It can be desirable to provide cost-effective hole transport materials for electronic devices. In general, hole transport materials can be acids, i.e., they can include an acidic moiety. In some embodiments, the hole transport layer can be in direct contact with a p-type photoactive conjugated polymer layer.

In general, an acid can be an inorganic acid or an organic acid. Examples of inorganic acids include sulfonic acid, nitric acid and hydrochloric acid. An organic acid can be, for example, polymeric or non-polymeric and fluorinated or nonfluorinated. Exemplary organic acid anions include sulfonates, carboxylates, phosphates, phosphonates, and mixtures thereof. In some embodiments, the acid is a sulfonic acid. In certain embodiments, the acid is a water-soluble acid or an organic solvent-soluble acid, such as a non-polymeric organic acid, a water soluble polymeric acid, or combinations thereof Examples of suitable non-polymeric organic acids include, but are not limited to, acetic acid, p-toluenesulfonic acid, camphorsulfonic acid, p-dodecylbenzenesulfonic acid, methanesulfonic acid, and trifluoromethanesulfonic acid. The corresponding acid anions include acetate, p-toluenesulfonate, camphorsulfonate, p-dodecylbenzenesulfonate, methanesulfonate, and trifluoromethanesulfonate, and mixtures thereof.

Non-polymeric fluorinated organic acid/salts can be soluble or dispersible in aqueous or non-aqueous liquid media have great promises as a hole transport material. Examples of non-polymeric fluorinated organic acids are non-polymeric fluorinated sulfonic acids, non-polymeric fluorinated phosphoric acids, non-polymeric fluorinated phosphonic acids, non-polymeric fluorinated carboxylic acids, non-polymeric fluorinated acrylic acids, and mixtures thereof. Examples of fluoroethersulfonic acids include, but are not limited to, 2-(1,1,2,3,3,3-hexafluoro-1-(perfluoroethoxy)propane-2-yloxy)-1,1,2,2-tetrafluoroethanesulfonic acid, 1,1,2,2-tetrafluoro-2-(per-fluoroethoxy)ethanesulfonic acid, and 2-(1,1,2,2-tetrafluoroethoxy)-1,1,2,2-tetrafluoroethanesulfonic acid.

Generally, any polymeric acid that is dispersible in the liquid medium is also suitable for use as a hole transport material. In some embodiments, these include polymeric acid selected form polymeric sulfonic acid, polymeric phosphoric acids, polymeric phosphonic acids, polymeric carboxylic acids, and polymeric acrylic acids, and mixtures thereof. In certain embodiments, the polymeric sulfonic acid is fluorinated. In still another embodiment, polymeric sulfonic acid comprises a perfluoroalkylenesulfonic acid.

In some embodiments, hole carrier layer 130 can be a single layer. In certain embodiments, hole carrier layer 130 can be formed of a single polymer. In some embodiments, hole carrier layer 130 can be a single layer formed of a single copolymer. As an example, in certain embodiments, hole carrier layer 130 can be a single layer containing a sulfonated tetrafluoroethylene copolymer as the only polymer. In some embodiments, the sulfonated tetrafluoroethylene copolymer can include ether groups within a tetrafluoroethylene (Teflon) backbone. In some embodiments, perfluorovinyl ether groups can be terminated with sulfonate or sulfonic acid groups onto a Teflon backbone. An exemplary sulfonated tetrafluoroethylene copolymer is sold under the trade name Nafion® and has a general polymer structure

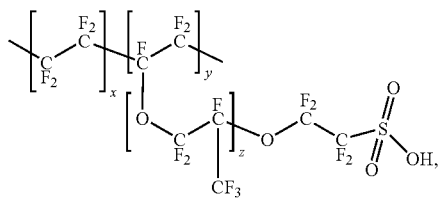

in which x, y, and z can be integers equal to 1, or greater than 1.

Without wishing to be bound by theory, it is believed that Nation®, an ionomer, partially dissociates into protonated and deprotonated forms when dissolved. Without wishing to be bound by theory, it is believed that, when used in a charge transport layer, the ionic species can facilitate hole migration from the photoactive layer 140 to the electrode 120.

Again without wishing to be bound by theory, it is believed that, because Nafion® is a fluorinated polymer, it may provide better resistance to the damaging effects of humidity on a photovoltaic device due to its inherent hydrophobicity. In comparison to PEDOT:PSS, for example, Nafion® is less acidic and thus may reduce the amount of etching that may occur to adjacent metal electrodes and the active layer. Nafion® may also have superior adhesion properties when compared with more traditional hole transport layers. Better electrical contact between the photoactive layer and the hole transport layer can result in higher device efficiencies as well as longer device lifetime.

In general, the thickness of hole carrier layer 130 (i.e., the distance between the surface of hole carrier layer 130 in contact with photoactive layer 140 and the surface of electrode 120 in contact with hole carrier layer 130) can be varied as desired. Typically, the thickness of hole carrier layer 130 is at least 0.01 micron (e.g., at least about 0.05 micron, at least about 0.1 micron, at least about 0.2 micron, at least about 0.3 micron, or at least about 0.5 micron) and/or at most about 50 microns (e.g., at most about 30 microns, at most about 10 microns, at most about five microns, at most about three microns, at most about two microns, or at most about one micron). In some embodiments, the thickness of hole carrier layer 130 is from about 0.01 micron to about 0.5 micron.

In one general aspect, hole carrier layer 130 can be applied to a substrate or a surface of another material by a variety of methods, including, for example, spin-coating, doctor blading, or dipping. In most embodiments, the thickness of the hole carrier layer 130 can be controlled during the application. In some embodiments, the hole carrier layer 130 material can first be dissolved into a liquid form such that it can be spread across a surface as a thin film. Preferred solvents can include those that provide for complete dissolution of the hole carrier layer 130 material when applying the material to a surface, and are easily removed during a curing step. In some embodiments, the curing step includes heating of the hole carrier layer which may be performed under vacuum. In some embodiments, the thickness of hole carrier layer 130 can be controlled by applying one or more subsequent layers of the same material on top of an existing hole carrier layer 130. The application methods include but not limited to spin coating, casting, spray, doctor blading, spray, slot die, screen printing.

Turning to the other components of photovoltaic cell 100, intermediate layer 150, at the thickness used in photovoltaic cell 100, can generally serve as an electron injection layer (e.g., to facilitate electron transfer to electrode 160) and a hole blocking layer (e.g., to substantially block the transport of holes to electrode 160). In some embodiments, intermediate layer 150 includes an electron donating compound, such as a nitrogen-containing compound, a phosphorus-containing compound, and/or a sulfur-containing compound. The electron donating compound can be a small molecule compound or a polymer. A "small molecule compound" mentioned herein refers to a compound with a molecular weight of at most about 1,000 Daltons (e.g., at most about 500 Daltons or at most about 250 Daltons). A "polymer" mentioned herein refers to a compound with a weight average molecule weight of at least about 1,000 Daltons (e.g., at least about 10,000 Daltons, at least about 100,000 Daltons, or at least about 1,000,000 Daltons).

In some embodiments, the electron donating compound includes a nitrogen-containing compound, such as an amine compound. In certain embodiments, the amine compound can contain at least one amino group, such as a primary amino group (e.g., $NH_2$), a secondary amino group (e.g., $NH(CH_3)$), or a tertiary amino group (e.g., $N(CH_3)_2$). In some embodiments, the amine compound can further include an alkoxylsilyl group, a chlorosilyl group, a carboxylic acid group, a carbonyl chloride group, a phosphonic acid group, a phosphoryl chloride group, or a thiol group. In certain embodiments, the amine compound can include a cyclic moiety that contains a ring nitrogen atom, such as a pyridyl group, a piperidinyl group, a pyrrolyl group, a pyrrolidinyl group, a pyrimidinyl group, an imidazolyl group, or a thiazolyl group.

In some embodiments, the amine compound is of the formula $R_1$—$N(R_2R_3)$, in which each of $R_1$, $R_2$, and $R_3$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl; or $R_1$ and $R_2$, $R_2$ and $R_3$, or $R_1$ and $R_3$, together with the nitrogen atom to which they are attached, are heteroaryl or $C_3$-$C_{20}$ heterocycloalkyl. For example, $R_1$ can be $C_1$-$C_{20}$ alkyl substituted with $Si(OR)_3$ or $NH(R)$, or aryl substituted with COOH or SH, in which each R, independently, is $C_1$-$C_{20}$ alkyl.

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —$CH_2$=$CH_2$—, —$CH_2$—CH=$CH_2$, and branched —$C_3H_7$. An alkoxy can be branch or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —OCH=CH—$CH_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieties include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, fluorenyl, anthryl, and phenanthryl. A heteroaryl can contain one or more aromatic rings, at least one of which contains at least one ring heteroatom (e.g., O, N, and S). Examples of heteroaryl moieties include furyl, furylene, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl and alkoxy include all of the above-recited substituents except $C_1$-$C_{20}$ alkyl. Cycloalkyl, heterocycloalkyl, aryl, and heteroaryl also include fused groups.

Exemplary amine compounds are shown below:

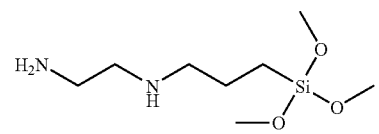

3-(2-aminoethyl)aminopropyl trimethoxy silane

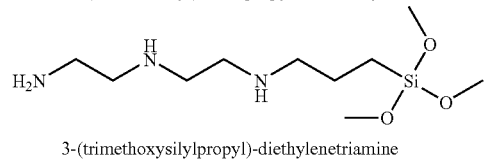

3-(trimethoxysilylpropyl)-diethylenetriamine

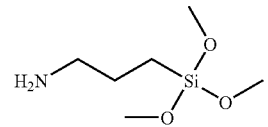

3-aminopropyl-trimethoxysilane

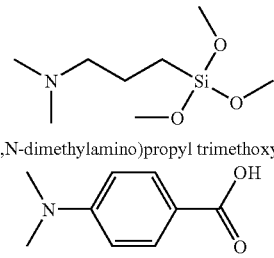

3-(N,N-dimethylamino)propyl trimethoxysilane 4-dimethylaminobenzoic acid

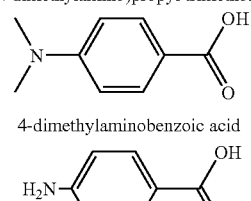

4-aminobenzoic acid

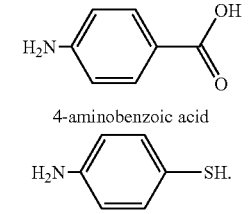

4-aminothiophenol

In some embodiments, at least some molecules of the amine compound are cross-linked. For example, when the amine compound contains an alkoxysilyl group, at least some molecules of the amine compound can be cross-linked with each other via reactions between the alkoxysilyl groups to form cross-linked polysiloxane molecules. Without wishing to be bound by theory, it is believed that intermediate layer 150 containing cross-linked molecules has improved adhesion with its neighboring layer (e.g., electrode 160).

In some embodiments, at least some molecules of the amine compound are adsorbed to a surface of its neighboring layer (e.g., electrode 160). For example, the adsorption can occur via a chemical reaction between a group on the molecules (e.g., an alkoxysilyl group or a carboxylic acid group) with a group (e.g., an hydroxyl group) on the surface of electrode 160 (e.g., an indium tin oxide electrode or a $TiO_2$-coated indium tin oxide electrode). Without wishing to be bound by theory, it is believed that this adsorption can improve the adhesion between intermediate layer 150 and its neighboring layer.

In some embodiments, the electron donating compound includes a phosphorus-containing compound. In certain embodiments, the phosphorus-containing compound can further include an alkoxylsilyl group, a chlorosilyl group, a carboxylic acid group, a carbonyl chloride group, a phosphonic acid group, a phosphoryl chloride group, or a thiol group. In some embodiments, the phosphorus-containing compound is of the formula $R_1—P(R_2R_3)$ or $O=P(R_1R_2R_3)$, in which each of $R_1$, $R_2$, and $R_3$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl; or $R_1$ and $R_2$, $R_2$ and $R_3$, or $R_1$ and $R_3$, together with the phosphorous atom to which they are attached, are heteroaryl or $C_3$-$C_{20}$ heterocycloalkyl. For example, each of $R_1$, $R_2$, and $R_3$ can be $C_1$-$C_{20}$ alkyl (e.g., butyl) or aryl (e.g., phenyl). Exemplary phosphorus-containing compounds include trialkylphosphines (e.g., tributylphosphine), triarylphosphines (e.g., triphenylphosphine), and phosphine oxides (e.g., tributylphosphine oxide or triphenylphosphine oxide).

In some embodiments, the electron donating compound includes a sulfur-containing compound. In certain embodiments, the sulfur-containing compound can further include an alkoxylsilyl group, a chlorosilyl group, a carboxylic acid group, a carbonyl chloride group, a phosphonic acid group, a phosphoryl chloride group, or a thiol group. In certain embodiments, the sulfur-containing compound can include a cyclic moiety that contains a ring sulfur atom, such as a thienyl group, a tetrahydrothienyl group, or a thiazolyl group. In some embodiments, the sulfur-containing compound is of the formula $R_1—S—R_2$, in which each of $R_1$ and $R_2$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl; or $R_1$ and $R_2$, together with the sulfur atom to which they are attached, are heteroaryl or $C_3$-$C_{20}$ heterocycloalkyl. Exemplary sulfur-containing compounds include tetrathiafulvalene (i.e., 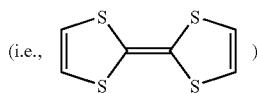 )

and substituted tetrathiafulvalene (e.g.,

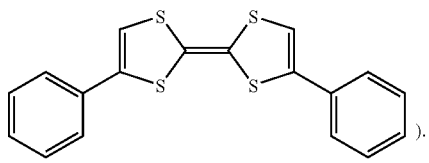 ).

In some embodiments, at least some of the molecules of the phosphorous-containing compound or the sulfur-containing compound can be cross-linked or adsorbed to a surface of its neighboring layer in the same manner as that described with respect to the amine compound.

In some embodiments, intermediate layer 150 has a thickness of at most about 50 nm (e.g., at most about 30 nm or at most about 10 nm) or at least about 1 nm (e.g., at least about 2 nm or at least about 5 nm. Without wishing to be bound by theory, it is believed that intermediate layer 150 having a suitable thickness facilitates electron transfer (e.g., through electron tunneling) from photoactive layer 140 to electrode 160. Further, without wishing to be bound by theory, it is believed that if intermediate layer 150 is too thick, its resistance would be too high and would hinder electron transfer, and if intermediate layer 150 is too thin, it would not form a desired ohmic contact with photoactive layer 140 and electrode 160.

Intermediate layer 150 can generally be prepared by any suitable methods. Examples of such methods include solution coating, ink jet printing, spin coating, dip coating, knife coating, bar coating, spray coating, roller coating, slot coating, gravure coating, flexographic printing, or screen printing. In some embodiments, intermediate layer 150 can be prepared by mixing an electron donating compound (e.g., an amine compound) with an organic solvent (e.g., an alcohol) to form a solution, coating the solution on an electrode, and drying the coated solution.

Without wishing to be bound by theory, it is believed that the amine compound in intermediate layer 150 facilitates formation of ohmic contact between photoactive layer 140 and electrode 160. Thus, such an intermediate layer allows use of an electrode or a layer (e.g., indium tin oxide, a high work function metal such as silver or gold, or a low work function metal oxide such as titanium oxide) that does not form ohmic contact with the photoactive layer by itself. For example, a conventional photovoltaic cell containing a hole blocking layer made of metal oxide (e.g., zinc oxide or titanium oxide) typically needs to be exposed to UV light to form ohmic contact between the metal oxide and photoactive layer 140. However, when such a hole blocking layer is used in combination with intermediate layer 150, intermediate layer 150 facilitates the formation of ohmic contact between the metal oxide and photoactive layer 140 without UV light exposure, thereby reducing damage to photovoltaic cell 100 resulted from such exposure.

Substrate 110 is generally formed of a transparent material. As referred to herein, a transparent material is a material which, at the thickness used in a photovoltaic cell 100, transmits at least about 60% (e.g., at least about 70%, at least about 75%, at least about 80%, at least about 85%) of incident light at a wavelength or a range of wavelengths used during operation of the photovoltaic cell. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 5,00 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 is at least about one micron (e.g., at least about five microns, at least about 10 microns) thick and/or at most about 1,000 microns (e.g., at most about 500 microns thick, at most about 300 microns thick, at most about 200 microns thick, at most about 100 microns, at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Electrode 120 is generally formed of an electrically conductive material. Exemplary electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., PEDOT), polyanilines (e.g., doped polyanilines), polypyrroles (e.g., doped polypyrroles). Exemplary electrically conducting metal oxides include indium tin oxide, fluorinated tin oxide, tin oxide and zinc oxide. In some embodiments, combinations of electrically conductive materials are used.

In some embodiments, electrode 120 can include a mesh electrode. Examples of mesh electrodes are described in commonly owned co-pending U.S. Patent Application Publication Nos. 20040187911 and 20060090791, the contents of which are hereby incorporated by reference.

In some embodiments, photoactive layer 140 contains an electron acceptor material (e.g., an organic electron acceptor material) and an electron donor material (e.g., an organic electron donor material).

Examples of electron acceptor materials include fullerenes, inorganic nanoparticles, oxadiazoles, discotic liquid crystals, carbon nanorods, inorganic nanorods, polymers containing moieties capable of accepting electrons or forming stable anions (e.g., polymers containing CN groups or polymers containing $CF_3$ groups), and combinations thereof. In some embodiments, the electron acceptor material is a substituted fullerene (e.g., PCBM). In some embodiments, a combination of electron acceptor materials can be used in photoactive layer 140.

Examples of electron donor materials include conjugated polymers, such as polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof. In some embodiments, the electron donor material can be polythiophenes (e.g., poly(3-hexylthiophene)), polycyclopentadithiophenes, and copolymers thereof. In certain embodiments, a combination of electron donor materials can be used in photoactive layer 140.

In some embodiments, the electron donor materials or the electron acceptor materials can include a polymer having a first comonomer repeat unit and a second comonomer repeat unit different from the first comonomer repeat unit. The first comonomer repeat unit can include a cyclopentadithiophene moiety, a silacyclopentadithiophene moiety, a cyclopentadithiazole moiety, a thiazolothiazole moiety, a thiazole moiety, a benzothiadiazole moiety, a thiophene oxide moiety, a cyclopentadithiophene oxide moiety, a polythiadiazoloquinoxaline moiety, a benzoisothiazole moiety, a benzothiazole moiety, a thienothiophene moiety, a thienothiophene oxide moiety, a dithienothiophene moiety, a dithienothiophene oxide moiety, or a tetrahydroisoindoles moiety.

In some embodiments, the first comonomer repeat unit includes a cyclopentadithiophene moiety. In some embodiments, the cyclopentadithiophene moiety is substituted with at least one substituent selected from the group consisting of $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, and $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, the cyclopentadithiophene moiety can be substituted with hexyl, 2-ethylhexyl, or 3,7-dimethyloctyl. In certain embodiments, the cyclopentadithiophene moiety is substituted at 4-position. In some embodiments, the first comonomer repeat unit can include a cyclopentadithiophene moiety of formula (1):

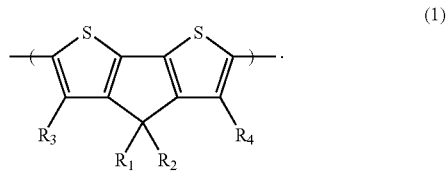

(1)

In formula (1), each of $R_1$, $R_2$, $R_3$, or $R_4$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, can be hexyl, 2-ethylhexyl, or 3,7-dimethyloctyl.

The second comonomer repeat unit can include a benzothiadiazole moiety, a thiadiazoloquinoxaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety. In some embodiments, the second comonomer repeat unit is a 3,4-benzo-1,2,5-thiadiazole moiety.

In some embodiments, the second comonomer repeat unit can include a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

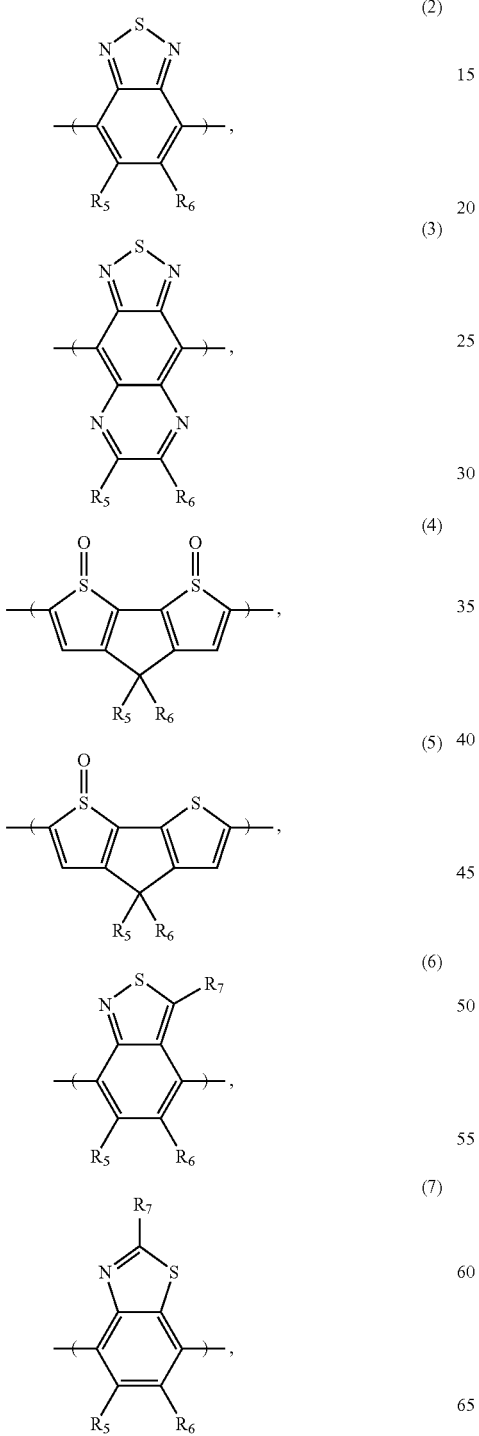

-continued

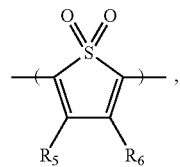  (8)

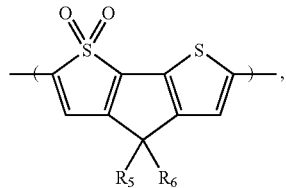  (9)

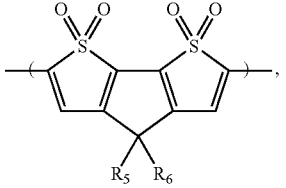  (10)

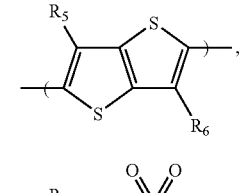  (11)

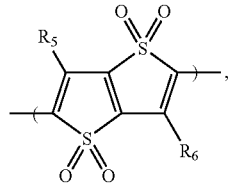  (12)

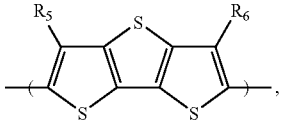  (13)

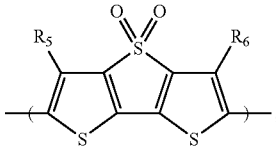  (14)

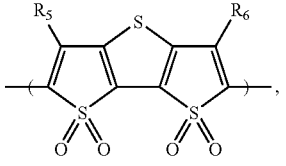  (15)

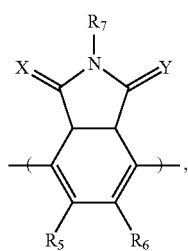  (16)

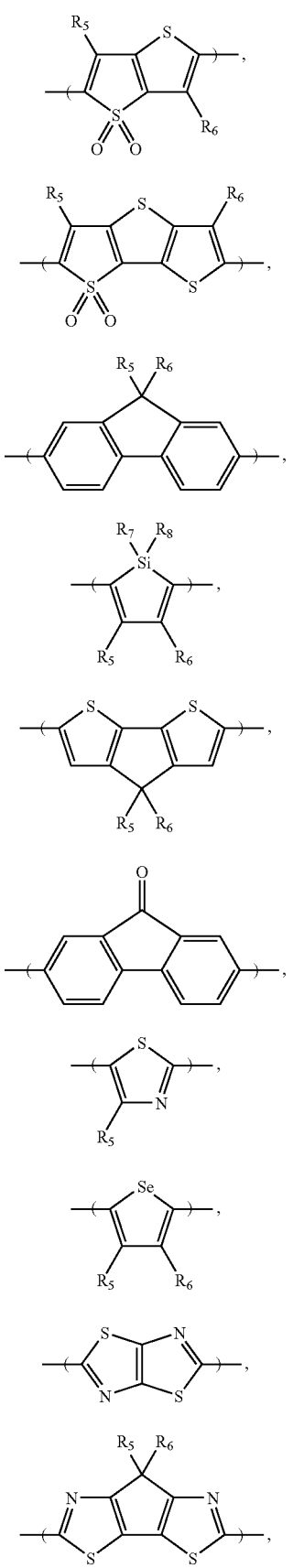
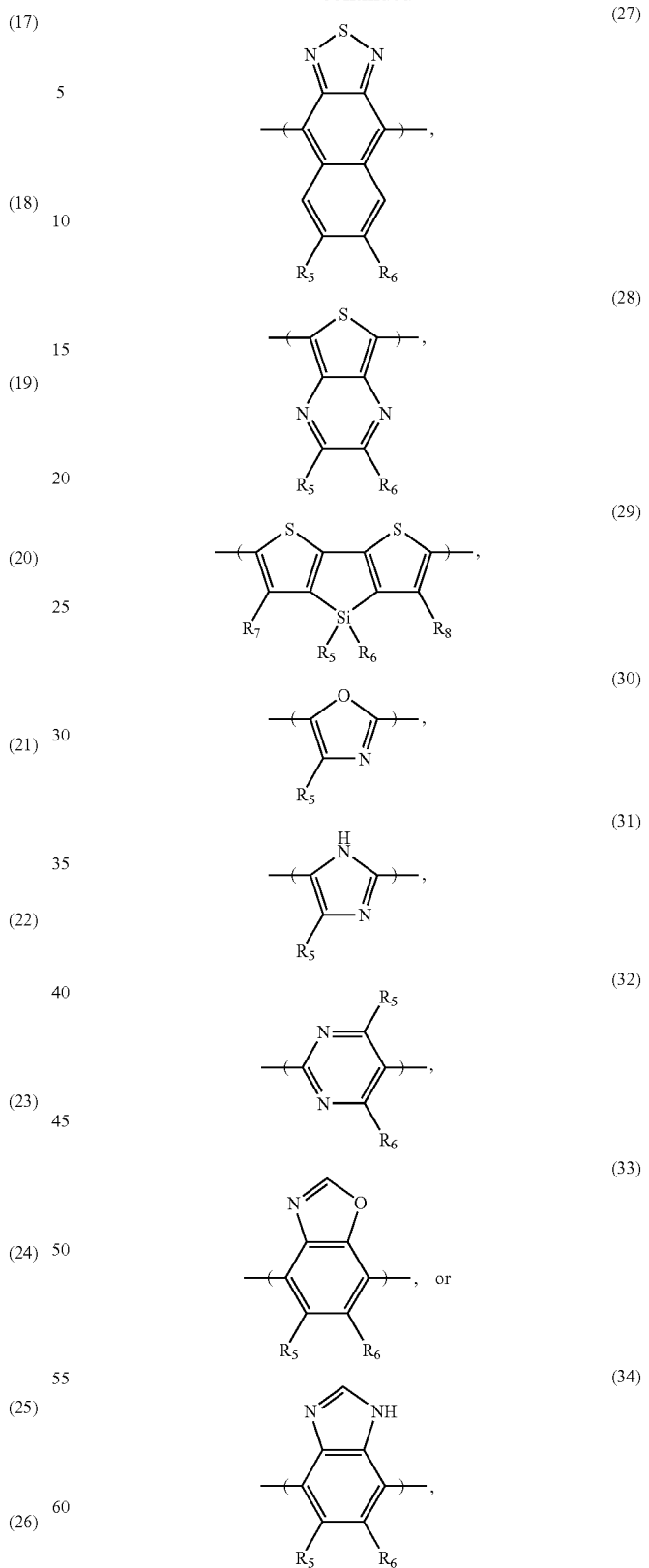
In the above formulas, each of X and Y, independently, is CH$_2$, O, or S; each of R$_5$ and R$_6$, independently, is H, C$_1$-C$_{20}$ alkyl, C$_1$-C$_{20}$ alkoxy, C$_3$-C$_{20}$ cycloalkyl, C$_1$-C$_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, the second comonomer repeat unit includes a benzothiadiazole moiety of formula (2), in which each of $R_5$ and $R_6$ is H.

The second comonomer repeat unit can include at least three thiophene moieties. In some embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. In certain embodiments, the second comonomer repeat unit includes five thiophene moieties.

The polymer can further include a third comonomer repeat unit that contains a thiophene moiety or a fluorene moiety. In some embodiments, the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the polymer can be formed by any combination of the first, second, and third comonomer repeat units. In certain embodiments, the polymer can be a homopolymer containing any of the first, second, and third comonomer repeat units.

In some embodiments, the polymer can be

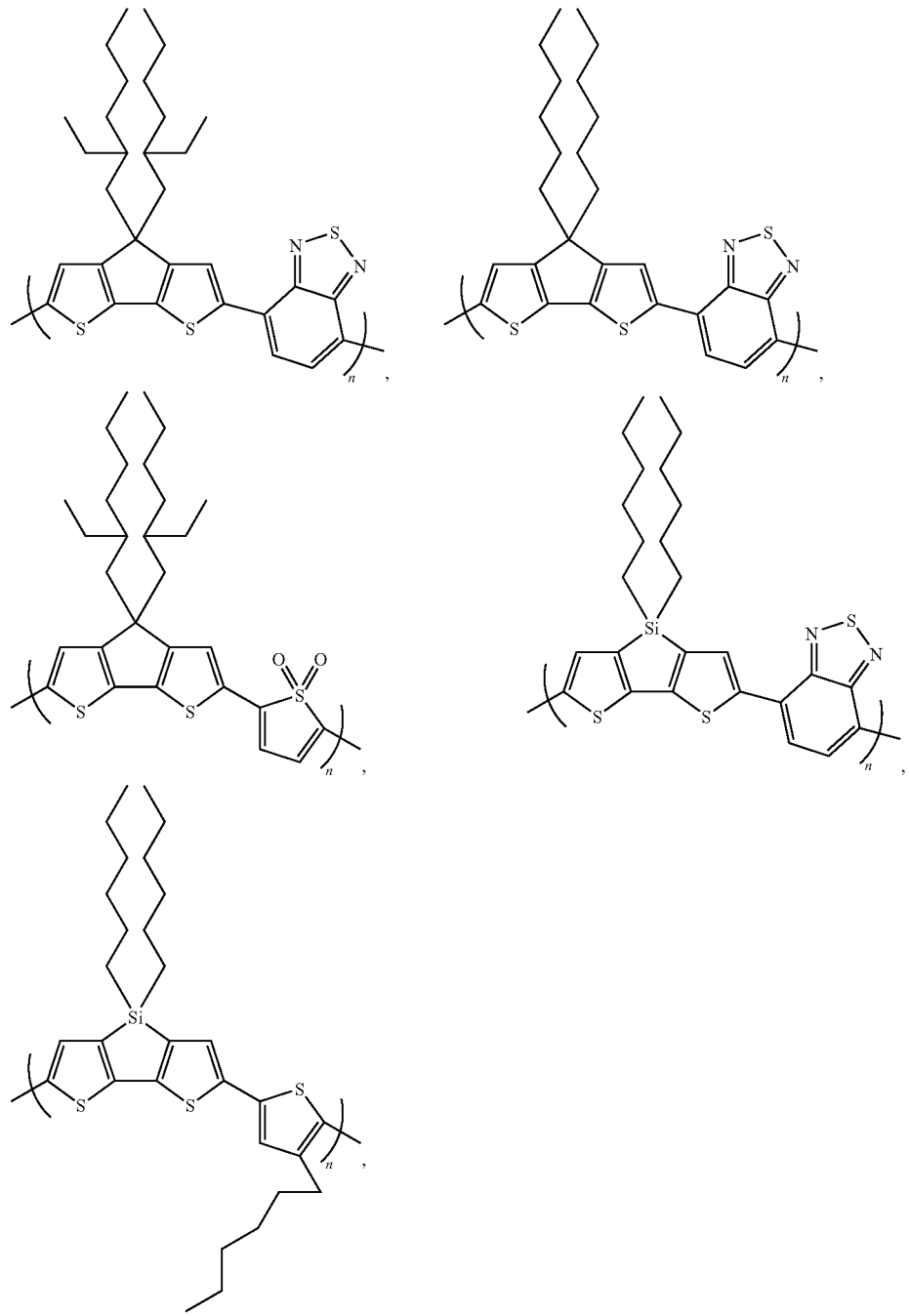

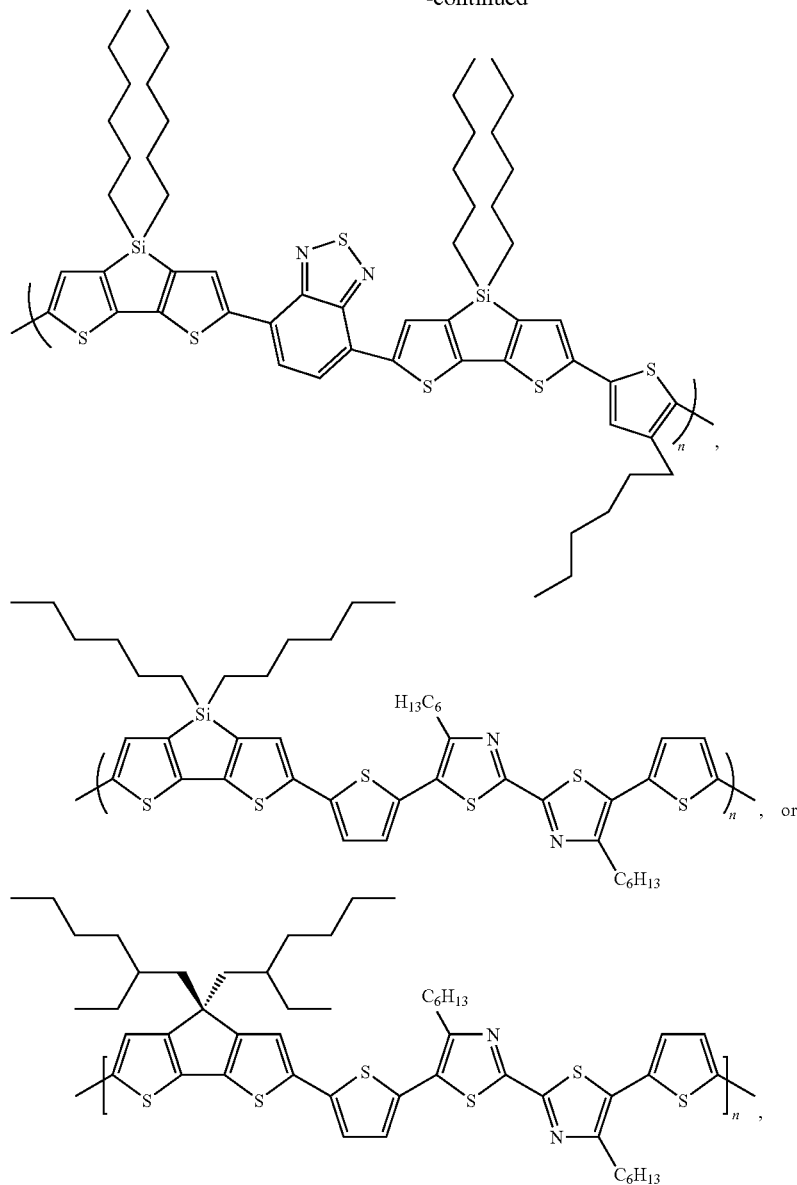

in which n can be an integer greater than 1.

The monomers for preparing the polymers mentioned herein may contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

The polymers described above can be prepared by methods known in the art, such as those described in commonly owned co-pending U.S. application Ser. No 11/601,374, the contents of which are hereby incorporated by reference. For example, a copolymer can be prepared by a cross-coupling reaction between one or more comonomers containing two alkylstannyl groups and one or more comonomers containing two halo groups in the presence of a transition metal catalyst. As another example, a copolymer can be prepared by a cross-coupling reaction between one or more comonomers containing two borate groups and one or more comonomers containing two halo groups in the presence of a transition metal catalyst. The comonomers can be prepared by the methods know in the art, such as those described in U.S. patent application Ser. No. 11/486,536, Coppo et al., *Macromolecules* 2003, 36, 2705-2711, and Kurt et al., *J. Heterocycl. Chem.* 1970, 6, 629, the contents of which are hereby incorporated by reference.

Without wishing to be bound by theory, it is believed that an advantage of the polymers described above is that their absorption wavelengths shift toward the red and near IR regions (e.g., 650-800 nm) of the electromagnetic spectrum, which is not accessible by most other conventional polymers. When such a polymer is incorporated into a photovoltaic cell together with a conventional polymer, it enables the cell to absorb the light in this region of the spectrum, thereby increasing the current and efficiency of the cell.

In some embodiments, photoactive layer 140 can contain an inorganic semiconductor material. In some embodiments, the inorganic semiconductor material includes group IV semiconductor materials, group III-V semiconductor materials, group II-VI semiconductor materials, chalcogen semiconductor materials, and semiconductor metal oxides. Examples of group IV semiconductor materials include amorphous silicon, crystalline silicon (e.g., microcrystalline silicon or polycrystalline silicon), and germanium. Examples of group III-V semiconductor materials include gallium arsenide and indium phosphide. Examples of group II-VI semiconductor materials include cadmium selenide and cadmium telluride. Examples of chalcogen semiconductor materials include copper indium selenide (CIS) and copper indium gallium selenide (CIGS). Examples of semiconductor metal oxides include copper oxides, titanium oxides, zinc oxides, tungsten oxides, molybdenum oxides, strontium copper oxides, or strontium titanium oxides. In certain embodiments, the bandgap of the semiconductor can be adjusted via doping. In some embodiments, the inorganic semiconductor material can include inorganic nanoparticles.

Generally, photoactive layer 140 is sufficiently thick to be relatively efficient at absorbing photons impinging thereon to form corresponding electrons and holes, and sufficiently thin to be relatively efficient at transporting the holes and electrons. In certain embodiments, photoactive layer 140 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, photoactive layer 140 is from about 0.1 micron to about 0.2 micron thick.

Electrode 160 is generally formed of an electrically conductive material, such as one or more of the electrically conductive materials described above. In some embodiments, electrode 160 is formed of a combination of electrically conductive materials. In certain embodiments, electrode 160 can be formed of a mesh electrode.

Optionally, photovoltaic cell 100 can include a hole blocking layer (not shown in FIG. 1) between intermediate layer 150 and electrode 160. The hole blocking layer is generally formed of a material that, at the thickness used in photovoltaic cell 100, transports electrons to electrode 160 and substantially blocks the transport of holes to electrode 160. Examples of materials from which the hole blocking layer can be formed include LiF and metal oxides (e.g., zinc oxide, titanium oxide).

Typically, the hole blocking layer is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

Without wishing to be bound by theory, it is believed that when photovoltaic cell 100 includes a hole blocking layer made of metal oxides (such as zinc oxide or titanium oxide), intermediate layer 150 can facilitate the formation of ohmic contact between the metal oxide and photoactive layer 140 without UV light exposure, thereby reducing damage to photovoltaic cell 100 resulted from such exposure.

Substrate 170 can be identical to or different from substrate 110. In some embodiments, substrate 170 can be formed of one or more suitable polymers, such as those described above.

In general, each of photoactive layer 140, intermediate layer 150, and the optional hole blocking layer described above can be prepared by a liquid-based coating process. The term "liquid-based coating process" mentioned herein refers to a process that uses a liquid-based coating composition. Examples of the liquid-based coating composition can be a solution, a dispersion, or a suspension. The concentration of a liquid-based coating composition can generally be adjusted as desired. In some embodiments, the concentration can be adjusted to achieve a desired viscosity of the coating composition or a desired thickness of the coating.

The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Without wishing to bound by theory, it is believed that the liquid-based coating process can be readily used in a continuous manufacturing process, such as a roll-to-roll process, thereby significantly reducing the cost of preparing a photovoltaic cell. Examples of roll-to-roll processes have been described in, for example, commonly-owned co-pending U.S. Application Publication No. 2005-0263179, the contents of which are hereby incorporated by reference.

In some embodiments, when a layer (e.g., layer 130, 140, or 150) includes inorganic semiconductor nanoparticles, the liquid-based coating process can be carried out by (1) mixing the nanoparticles (e.g., CIS or CIGS nanoparticles) with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a photoactive layer, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process.

In general, the liquid-based coating process used to prepare a layer containing an organic semiconductor material can be the same as or different from that used to prepare a layer containing an inorganic semiconductor material. In some embodiments, when a layer (e.g., layer 130, 140, or 150) includes an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion. For example, an organic photoactive layer can be prepared by mixing an electron donor material (e.g., P3HT) and an electron acceptor material (e.g., PCBM) in a suitable solvent (e.g., xylene) to form a dispersion, coating the dispersion onto a substrate, and drying the coated dispersion.

The liquid-based coating process can be carried out at an elevated temperature (e.g., at least about 50° C., at least about 100° C., at least about 200° C., or at least about 300° C.). The temperature can be adjusted depending on various factors, such as the coating process and the coating composition used. For example, when preparing a layer containing inorganic nanoparticles, the nanoparticles can be sintered at a high temperature (e.g., at least about 300° C.) to form interconnected nanoparticles. On the other hand, when a polymeric linking agent (e.g., poly(n-butyl titanate)) is added to the inorganic nanoparticles, the sintering process can be carried out at a lower temperature (e.g., below about 300° C.).

In some embodiments, photovoltaic cell 100 can be prepared as follows: An ITO coated glass substrate can be cleaned by sonicating in an organic solvent (e.g., acetone and/or isopropanol) for a certain amount of time (e.g., 5-15 minutes). The substrate can then be treated with UV/ozone. A TiO$_2$ layer is applied. Then, a semiconductor blend of P3HT and PCBM with a suitable weight ratio (e.g., 1-1.5:1) in an organic solvent (e.g., an aromatic solvent) can be blade-coated at a certain temperature (e.g., 50-80° C.) onto the film and then dried. A layer of hole transport layer 130, for example, a layer of Nafion® can be blade-coated on top of the semiconductor blend. The device can then be annealed (e.g., in a glove box) at a suitable temperature (e.g., 150-200° C.) for a certain amount of time (e.g., 3-10 minutes), followed by thermal evaporation of silver as the top metal electrode (e.g., having a thickness of 50-150 nm) to form photovoltaic cell 100.

Figure 2:
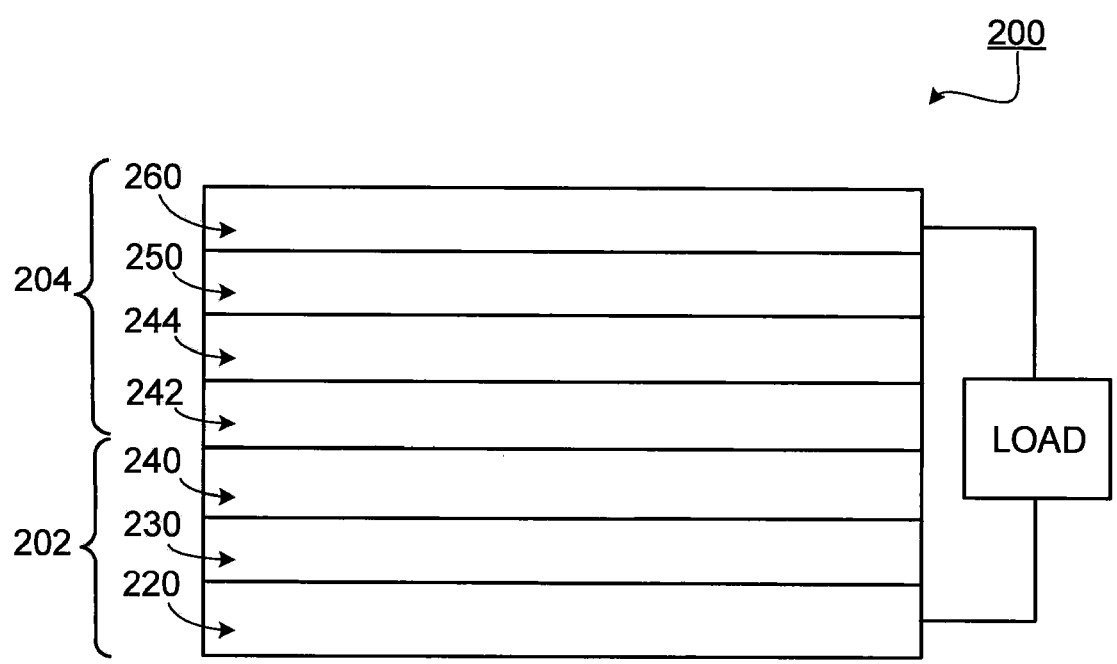
FIG. 2 is a cross-sectional view of an embodiment of a tandem photovoltaic cell.

FIG. 2 shows a tandem photovoltaic cell 200 having two semi-cells 202 and 204. Semi-cell 202 includes an electrode 220, a hole carrier layer 230, a first photoactive layer 240, and a recombination layer 242. Semi-cell 204 includes a recombination layer 242, a second photoactive layer 244, an intermediate layer 250, and an electrode 260. An external load is connected to photovoltaic cell 200 via electrodes 220 and 260. Depending on the production process and the desired device architecture, the current flow in a semi-cell can be reversed by changing the electron/hole conductivity of a certain layer (e.g., changing hole carrier layer 230 to a hole blocking layer) By doing so, a tandem cell can be designed such that the semi-cells in the tandem cells can be electrically interconnected either in series or in parallel.

In general, intermediate layer 250 can be formed of the same materials, or have the same physical characteristics (e.g., the same thickness or electron injection properties), as noted above regarding intermediate layer 150. In some embodiments, intermediate layer 250 can be disposed at locations other than that shown in FIG. 2. For example, when recombination layer 242 includes a layer containing a p-type semiconductor material, intermediate layer 250 can be disposed between the first or second photoactive layer and the layer containing the p-type semiconductor material to facilitate ohmic contact between these layers. In some embodiments, tandem cell 200 can include two or more intermediate layers 250. In certain embodiments, each semi-cell of tandem cell 200 can include an intermediate layer 250.

A recombination layer refers to a layer in a tandem cell where the electrons generated from a first semi-cell recombine with the holes generated from a second semi-cell. Recombination layer 242 typically includes a p-type semiconductor material and an n-type semiconductor material. In general, n-type semiconductor materials selectively transport electrons and p-type semiconductor materials selectively transport holes. As a result, electrons generated from the first semi-cell recombine with holes generated from the second semi-cell at the interface of the n-type and p-type semiconductor materials.

In some embodiments, the p-type semiconductor material includes a polymer and/or a metal oxide. Examples p-type semiconductor polymers include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants includes salts or acids of fluoride, chloride, bromide, and iodide. In some embodiments, the metal oxide can be used in the form of nanoparticles.

In some embodiments, the n-type semiconductor material includes a metal oxide, such as a titanium oxide, a zinc oxide, a tungsten oxide, a molybdenum oxide, and a combination thereof. The metal oxide can be used in the form of nanoparticles. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one layer. In certain embodiments, the recombination layer includes two layers, one layer including the p-type semiconductor material and the other layer including the n-type semiconductor material. In such embodiments, recombination layer 242 can also include a layer of mixed n-type and p-type semiconductor material at the interface of the two layers.

In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the n-type semiconductor material.

Recombination layer 242 generally has a sufficient thickness so that the layers underneath are protected from any solvent applied onto recombination layer 242. In some embodiments, recombination layer 242 can have a thickness at least about 10 nm (e.g., at least about 20 nm, at least about 50 nm, or at least about 100 nm) and/or at most about 500 nm (e.g., at most about 200 nm, at most about 150 nm, or at most about 100 nm).

In general, recombination layer 242 is substantially transparent. For example, at the thickness used in a tandem photovoltaic cell 200, recombination layer 242 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the photovoltaic cell.

Recombination layer 242 generally has a sufficiently low surface resistivity. In some embodiments, recombination layer 242 has a resistivity of at most about $1\times10^6$ ohm/square (e.g., at most about $5\times10^5$ ohm/square, at most about $2\times10^5$ ohm/square, or at most about $1\times10^5$ ohm/square).

Without wishing to be bound by theory, it is believed that recombination layer 242 can be considered as a common electrode between two semi-cells (e.g., one including electrode 220, hole carrier layer 230, photoactive layer 240, and recombination layer 242, and the other include recombination layer 242, photoactive layer 244, hole blocking layer 250, and electrode 260) in photovoltaic cells 200. In some embodiments, recombination layer 242 can include an electrically conductive mesh material, such as those described above. An electrically conductive mesh material can provide a selective contact of the same polarity (either p-type or n-type) to the semi-cells and provide a highly conductive but transparent layer to transport electrons to a load.

In some embodiments, recombination layer 242 can be prepared by applying a blend of an n-type semiconductor material and a p-type semiconductor material on a photoactive layer. For example, an n-type semiconductor and a p-type semiconductor can be first dispersed and/or dissolved in a solvent together to form a dispersion or solution, which can then be coated on a photoactive layer to form a recombination layer.

In some embodiments, recombination layer 242 can include two or more layers with required electronic and optical properties for tandem cell functionality. For example, recombination layer 242 can include a layer that contains an n-type semiconductor material and a layer that contains a p-type semiconductor material. In some embodiments, the layer containing an n-type semiconductor material is disposed between photoactive layer 240 and the layer that contains a p-type semiconductor material. In some embodiments, when the n-type semiconductor material includes a metal oxide (e.g., zinc oxide or titanium oxide), an intermediate layer that includes a nitrogen-containing compound, a phosphorus-containing compound, or a sulfur-containing compound can be disposed between photoactive layer 240 and the layer containing the n-type semiconductor material to facilitate formation of ohmic contact between these two layers. The intermediate layer can be formed of the same material, or having the same characteristics, as intermediate layer 250. In certain embodiments, the layer containing an n-type semiconductor material can be replaced by the just-mentioned intermediate layer. In such embodiments, the intermediate layer can serve both as an electron injection layer and a hole blocking layer. In such embodiments, semi-cell 202 (e.g., including electrode 220, hole carrier layer 230, first photoactive layer 240, and an intermediate layer) can have the layers with the same function arranged in the same order as those in semi-cell 204 (e.g., including a layer containing a p-type semiconductor material that can serve as a hole carrier layer, second photoactive layer 244, intermediate layer 250, and electrode 260).

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used a p-type semiconductor, a polymer layer can be formed by first dissolving the polymer in a solvent (e.g., an anhydrous alcohol) to form a solution and then coating the solution on a photoactive layer.

Other components in tandem cell 200 can be identical to the corresponding components described with respect to photovoltaic cell 100. For example, tandem cell 200 can include a hole blocking layer (not shown in FIG. 2) between intermediate layer 250 and electrode 260. This hole block layer can be formed of the same materials, or have the same physical characteristics (e.g., the same thickness or hole blocking properties), as noted above regarding the hole blocking layer in photovoltaic cell 100.

While certain embodiments have been disclosed, other embodiments are also possible.

In some embodiments, photovoltaic cell 100 can include cathode as a bottom electrode and anode as a top electrode. In certain embodiments, photovoltaic cell 100 can include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: substrate 170, an electrode 160, an intermediate layer 150, a photoactive layer 140, a hole carrier layer 130, an electrode 120, and a substrate 110.

Figure 3:
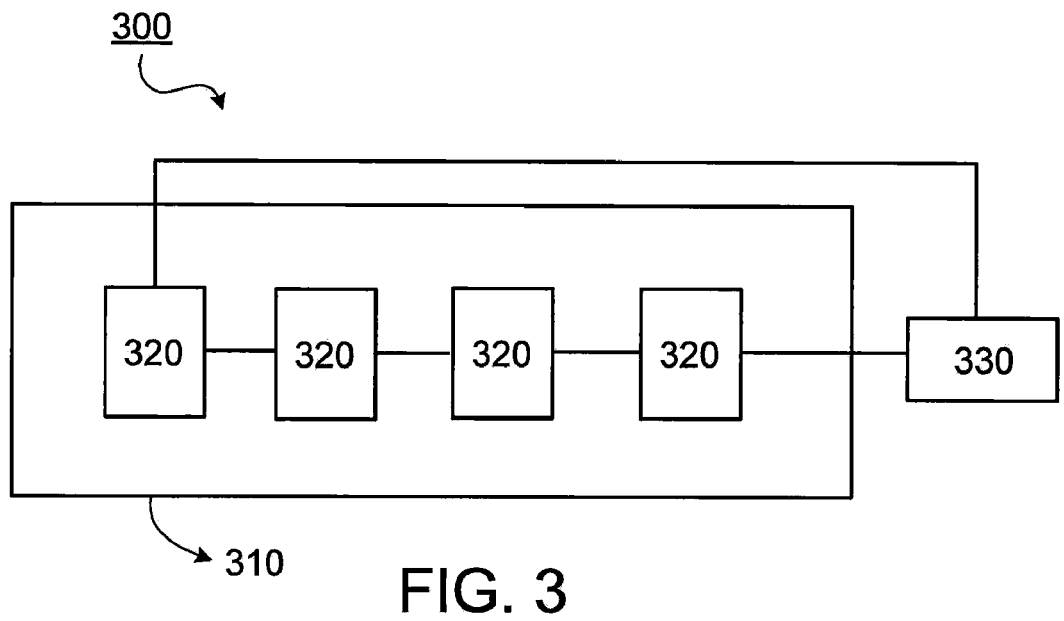
FIG. 3 is a schematic of a system containing multiple photovoltaic cells electrically connected in series.
Figure 4:
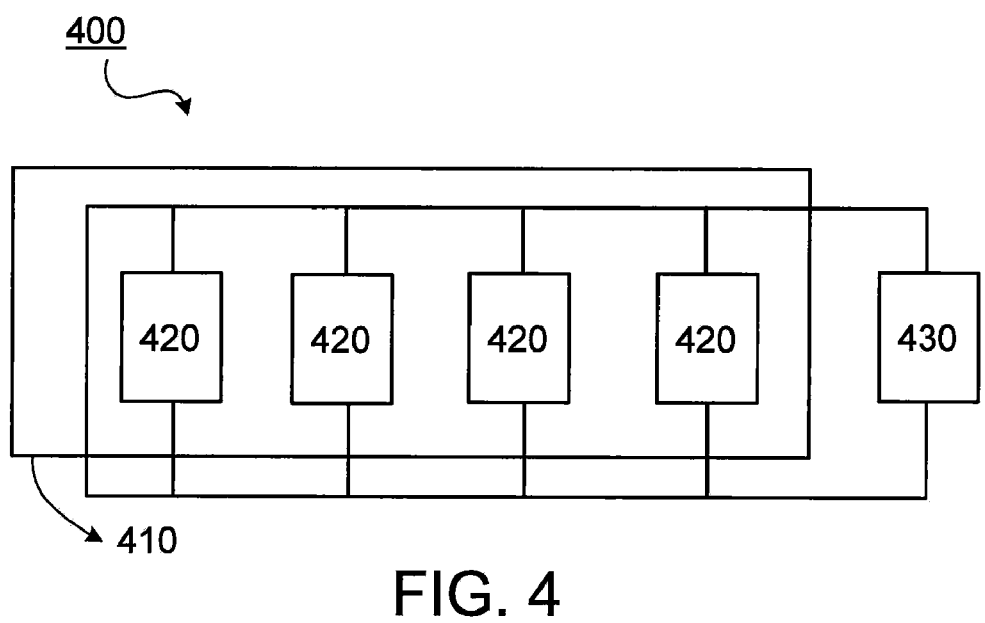
FIG. 4 is a schematic of a system containing multiple photovoltaic cells electrically connected in parallel.

In some embodiments, multiple photovoltaic cells can be electrically connected to form a photovoltaic system. As an example, FIG. 3 is a schematic of a photovoltaic system 300 having a module 310 containing photovoltaic cells 320. Cells 320 are electrically connected in series, and system 300 is electrically connected to a load 330. As another example, FIG. 4 is a schematic of a photovoltaic system 400 having a module 410 that contains photovoltaic cells 420. Cells 420 are electrically connected in parallel, and system 400 is electrically connected to a load 430. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

In some embodiments, the semi-cells in a tandem cell are electrically interconnected in series. When connected in series, in general, the layers can be in the order shown in FIG. 2. In certain embodiments, the semi-cells in a tandem cell are electrically interconnected in parallel. When interconnected in parallel, a tandem cell having two semi-cells can include the following layers: a first cathode, a first hole carrier layer, a first photoactive layer, a first hole blocking layer (which can serve as an anode), a second hole blocking layer (which can serve as an anode), a second photoactive layer, a second hole carrier layer, and a second cathode. In such embodiments, the first and second hole blocking layers can be either two separate layers or can be one single layer. In case the conductivity of the first and second hole blocking layer is not sufficient, an additional layer (e.g., an electrically conductive mesh layer) providing the required conductivity may be inserted.

In some embodiments, a tandem cell can include more than two semi-cells (e.g., three, four, five, six, seven, eight, nine, or ten semi-cells). In certain embodiments, some semi-cells can be electrically interconnected in series and some semi-cells can be electrically interconnected in parallel.

While photovoltaic cells have been described above, in some embodiments, the polymers described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs, polymer LEDs or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

Other embodiments are in the claims.

What is claimed is:
1. An article, comprising:
   first and second electrodes;
   a photoactive layer between the first and second electrodes; and
   a hole transport layer between the first electrode and the photoactive layer, the hole transport layer consisting of an ionic copolymer,
   wherein the article is configured as a photovoltaic cell.
2. The article of claim 1, wherein some of the copolymer is present in the photoactive layer.

3. The article of claim 1, wherein the photoactive layer comprises an electron acceptor material and an electron donor material, and some of the copolymer is in contact with the electron acceptor material and the electron donor material beneath a surface of the photoactive layer.

4. The article of claim 3, wherein the electron donor material comprises a polymer and the electron acceptor material comprises a fullerene.

5. The article of claim 1, wherein the ionic copolymer comprises a tetrafluoroethylene backbone.

6. The article of claim 5, wherein a structural unit of the ionic copolymer comprises a perfluorovinyl ether group.

7. The article of claim 6, wherein the perfluorovinyl ether group is terminated with a sulfonyl group.

8. The article of claim 1, wherein the ionic copolymer has the chemical structure

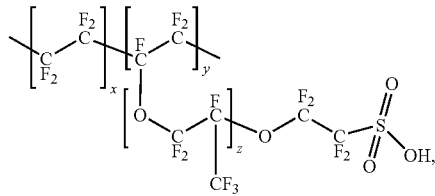

wherein x, y, and z are integer values of one (1) or greater than one (1).

9. The article of claim 1, wherein the hole transport layer has a thickness of at most 50 microns.

10. The article of claim 1, wherein the hole transport layer has a thickness of at most 30 microns.

11. The article of claim 1, wherein the hole transport layer has a thickness of at most 10 microns.

12. The article of claim 1, wherein the hole transport layer has a thickness of at least 0.01 micron.

13. The article of claim 1, wherein the hole transport layer has a thickness of at least 0.5 micron.

14. The article of claim 1, further comprising an electron injection layer between the first and second electrode.

15. The article of claim 14, wherein the electron injection layer has a thickness of 10 nm to 300 nm.

16. The article of claim 1, wherein the photoactive layer comprises an electron donor material and an electron acceptor material.

17. The article of claim 16, wherein the electron donor material comprises a polymer.

18. The article of claim 17, wherein the polymer is selected from the group consisting of polythiophenes, polyanilines, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof.

19. The article of claim 18, wherein the electron donor material comprises a polymer selected from the group consisting of polythiophenes, polycyclopentadithiophenes, and copolymers thereof.

20. The article of claim 19, wherein the electron donor material comprises poly(3-hexylthiophene) or poly(cyclopentadithiophene-co-benzothiadiazole).

21. The article of claim 16, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

22. The article of claim 21, wherein the electron acceptor material comprises a substituted fullerene.

23. The article of claim 22, wherein the substituted fullerene comprises PCBM.

24. An article, comprising:
a hole transport layer having first and second sides, the first side of the hole transport layer contacting an electrode, the second side of the hole transport layer contacting a photoactive layer, and the hole transport layer consisting of an ionic copolymer,
wherein the article is configured as a photovoltaic cell.

25. A system, comprising:
a plurality of photovoltaic cells according to claim 1,
wherein the plurality of photovoltaic cells are configured as a photovoltaic system.

26. The system of claim 25, wherein at least some of the plurality of photovoltaic cells are electrically connected in series.

27. The system of claim 25, wherein at least some of the plurality of photovoltaic cells are electrically connected in parallel.

28. A system, comprising:
a plurality of photovoltaic cells according to claim 24,
wherein the plurality of photovoltaic cells are configured as a photovoltaic system.

29. The system of claim 28, wherein at least some of the plurality of photovoltaic cells are electrically connected in series.

30. The system of claim 28, wherein at least some of the plurality of photovoltaic cells are electrically connected in parallel.

* * * * *

UNITED STATES PATENT AND TRADEMARK OFFICE
CERTIFICATE OF CORRECTION

PATENT NO.        : 8,178,779 B2                                    Page 1 of 1
APPLICATION NO.   : 12/260416
DATED             : May 15, 2012
INVENTOR(S)       : Jin-An He It is certified that error appears in the above-identified patent and that said Letters Patent is hereby corrected as shown below:

Column 25,
Line 53, delete "polyisothianaphthanenes," and insert --polyisothianaphthalenes,--

Signed and Sealed this
Twenty-fourth Day of July, 2012

David J. Kappos
*Director of the United States Patent and Trademark Office*